(12) United States Patent
Lee et al.

(10) Patent No.: US 11,763,710 B2
(45) Date of Patent: Sep. 19, 2023

(54) DISPLAY DEVICE AND A TESTING METHOD THEREOF

(71) Applicant: SAMSUNG DISPLAY CO., LTD., Yongin-si (KR)

(72) Inventors: Kwang Sae Lee, Asan-si (KR); Ji-Hyun Ka, Seongnam-si (KR); Won Kyu Kwak, Seongnam-si (KR); Ki Myeong Eom, Suwon-si (KR); Hai-Jung In, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/731,382

(22) Filed: Apr. 28, 2022

(65) Prior Publication Data

US 2022/0262290 A1    Aug. 18, 2022

Related U.S. Application Data

(62) Division of application No. 16/572,700, filed on Sep. 17, 2019, now Pat. No. 11,341,875.

(30) Foreign Application Priority Data

Sep. 17, 2018   (KR) .................. 10-2018-0110967

(51) Int. Cl.
*G01R 27/08*        (2006.01)
*G01R 31/28*        (2006.01)
(Continued)

(52) U.S. Cl.
CPC ............. *G09G 3/006* (2013.01); *G01R 27/08* (2013.01); *G01R 31/2836* (2013.01);
(Continued)

(58) Field of Classification Search
CPC .......... G01R 27/08; G01R 31/28; G09G 3/00; G09G 3/06; G09G 3/20; G09G 3/32
See application file for complete search history.

(56) References Cited

U.S. PATENT DOCUMENTS 11,341,875 B2 *   5/2022   Lee ................... G09G 3/035
2010/0053604 A1   3/2010   Rice
(Continued)

FOREIGN PATENT DOCUMENTS

KR   10-2014-0055674   5/2014
KR   10-2015-0068050   6/2015
(Continued)

OTHER PUBLICATIONS

European Search Report issued in corresponding European Patent Application No. 19197458.3 dated Nov. 27, 2019.
(Continued)

*Primary Examiner* — Neel D Shah
(74) *Attorney, Agent, or Firm* — F. Chau & Associates, LLC

(57) ABSTRACT

A display device including: a substrate including a display area and a peripheral area peripheral to the display area; a plurality of pads disposed in a pad area, wherein the pad area is disposed in the peripheral area and the pad area includes an integrated circuit (IC); and a first crack detecting line connected to a first pad and a second pad at a first node, and a third pad at a second node, wherein the first crack detecting line is disposed in the peripheral area between the first node and the second node.

10 Claims, 15 Drawing Sheets

(51) Int. Cl.
    *G09G 3/00*     (2006.01)
    *G09G 3/06*     (2006.01)
    *G09G 3/20*     (2006.01)
    *G09G 3/32*     (2016.01)

(52) U.S. Cl.
    CPC ..... *G09G 3/035* (2020.08); *G09G 2300/0426* (2013.01); *G09G 2330/12* (2013.01)

(56) References Cited

U.S. PATENT DOCUMENTS

| | | |
|---|---|---|
| 2016/0351093 A1* | 12/2016 | Kim ............... G06F 3/0412 |
| 2018/0033354 A1 | 2/2018 | Lee et al. |
| 2018/0158741 A1 | 6/2018 | Kim et al. |
| 2018/0174505 A1 | 6/2018 | Mandlik |
| 2018/0342185 A1 | 11/2018 | Lee et al. |
| 2020/0090566 A1 | 3/2020 | Lee et al. |

FOREIGN PATENT DOCUMENTS

| | | |
|---|---|---|
| KR | 10-2017-0033966 | 3/2017 |
| KR | 10-2017-0099628 | 9/2017 |

OTHER PUBLICATIONS

European Search Report issued in corresponding European Patent Application No. 19197458.3 dated Feb. 25, 2020.

\* cited by examiner

DISPLAY DEVICE AND A TESTING METHOD THEREOF

CROSS-REFERENCE TO RELATED APPLICATIONS

This application is a Divisional of U.S. patent application Ser. No. 16/572,700 filed on Sep. 17, 2019, which claims priority under 35 U.S.C. § 119 to Korean Patent Application. No. 10-2018-0110967 filed in the Korean Intellectual Property Office on Sep. 17, 2018 the disclosures of which are incorporated by reference herein in their entireties.

FIELD

The present invention relates to a display device and a testing method thereof.

DESCRIPTION OF THE RELATED ART

As display devices are becoming smaller, lighter, and thinner, they are being designed with increased durability to protect against cracks, scratches, breaks, etc., which may be caused by an external impact or the like.

A display device may include a display panel including pixels that display an image. When a crack occurs in the display panel, a foreign material such as moisture may penetrate into a display area of the display panel. When a foreign material enters the display area via a crack, it may cause display panel defects.

For example, when a flexible display has a minute crack in a substrate or stacked layer of its display panel, the minute crack may become a larger crack due to curving or bending the flexible display during its manufacture or use.

Accordingly, various methods are being developed to test whether a display panel is cracked or not.

SUMMARY

An exemplary embodiment of the present invention provides a display device including: a substrate including a display area and a peripheral area peripheral to the display area; a plurality of pads disposed in a pad area, wherein the pad area is disposed in the peripheral area and the pad area includes an integrated circuit (IC); and a first crack detecting line connected to a first pad and a second pad at a first node, and a third pad at a second node, wherein the first crack detecting line is disposed in the peripheral area between the first node and the second node.

The first node may be disposed outside the pad area.

The display device may further include a first wire connecting the first pad and the first crack detecting line, and a second wire connecting the second pad and the first crack detecting line, wherein the first wire and the second wire may be disposed in the same layer, and the first crack detecting line is disposed in a different layer from the first and second wires.

The display device may further include a second crack detecting line connected to a fourth pad, and a fifth pad, wherein the second crack detecting line is disposed in the peripheral area, is disposed at the same side of the display area with the first crack detecting line, and is closer to the display area than the first crack detecting line.

The display device may further: include a second crack detecting line connected to a fourth pad and a fifth pad at a third node, and a sixth pad at a fourth node, wherein the second crack detecting line is disposed in the peripheral area between the third node and the fourth node, is disposed at the same side of the display area with the first crack detecting line, and is closer to the display area than the first crack detecting line; and a third crack detecting line connected to a seventh pad, and an eighth pad, and is disposed in a bendable area in the peripheral area.

The display device may further include a voltage transmitting line disposed in the peripheral area and configured to transmit a power supply voltage, wherein the first crack detecting line, the second crack detecting line, and the third crack detecting line may be disposed in the same layer as the voltage transmitting line.

The first node may be disposed inside the pad area.

The IC disposed in the pad area is configured to test for a crack of the display device.

The IC may include a variable resistor, a current regulator that supplies a first current to the variable resistor and supplies a second current to the first crack detecting line through the first pad or the second pad, and a comparator that compares a voltage applied to the variable resistor with a voltage applied to the first crack detecting line and outputs a result of the comparison.

The second current may be the same as the first current.

The second current may be different from the first current.

The first crack detecting line may be connected to a fourth pad at the second node.

Another exemplary embodiment of the present invention provides a display device including: a substrate including a display area and a peripheral area peripheral to the display area; a plurality of pixels disposed in the display area; a plurality of pads disposed in the peripheral area; a data line including a first end connected to a first pad and a second end connected to a first portion of the pixels; and a crack detecting line connected to a second pad and a third pad at a first node, and a fourth pad at a second node, wherein the crack detecting line is disposed in the peripheral area between the first node and the second node, wherein the data line and the crack detecting line may be disposed in the same layer.

The display device may further include a gate driver configured to supply a gate signal to the plurality of pixels, a gate line including a first end connected to the gate driver and a second end connected to a second portion of the pixels, a first wire connecting the second pad and the crack detecting line, and a second wire connecting the third pad and the crack detecting line, wherein the first wire and the second wire may be disposed in the same layer as the gate line.

The display device may further include a driving IC connected to the plurality of pads to supply a data signal to the data line through the first pad, and to measure a resistance value of the crack detecting line through the second pad, the third pad, and the fourth pad.

Another exemplary embodiment of the present invention provides a testing method of a display device, wherein the display device includes: a substrate including a display area and a peripheral area peripheral to the display area; a plurality of pads disposed in a pad area in which an IC is disposed; and a first crack detecting line connected to a first pad and a second pad at a first node, and a third pad at a second node, wherein the first crack detecting line is disposed in the peripheral area between the first node and the second node, the testing method including: detecting a resistance of the first crack detecting line by applying a first current to the first pad; and detecting a resistance of the first crack detecting line by applying a second current that is lower than the first current to the second pad when the resistance of the first crack detecting line exceeds a first threshold.

The IC may include a variable resistor, a current regulator that supplies a third current to the variable resistor and supplies a current to the first crack detecting line through the first pad or the second pad, and a comparator that compares a voltage applied to the variable resistor with a voltage applied to the first crack detecting line and outputs a result of the comparison, and the first current may be the same as the third current.

The second current may be different from the third current.

The second current may be smaller than the third current.

The testing method of the display device may further include, after the detecting of the resistance of the first crack detecting line by applying the second current that is lower than the first current to the second pad, determining that a first crack occurs when the resistance of the first crack detecting line is less than a second threshold.

The testing method of the display device may further include, after the detecting of the resistance of the first crack detecting line by applying the second current that is lower than the first current to the second pad, determining that a second crack occurs when the resistance of the first crack detecting line is equal to or greater than the second threshold, wherein the second crack is longer than the first crack.

According to an exemplary embodiment of the present invention, a display device includes: a substrate including a display area and a peripheral area peripheral to the display area; a plurality of pads disposed in a pad area of the peripheral area; and a first crack detecting line connected to a first input pad and a second input pad at a first node, and a third output pad and a fourth output pad at a second node, wherein a resistance value of the first crack detecting line is detectable by applying different currents to the first crack detecting line via the first and second input pads.

DETAILED DESCRIPTION OF THE EMBODIMENTS

Figure 1:
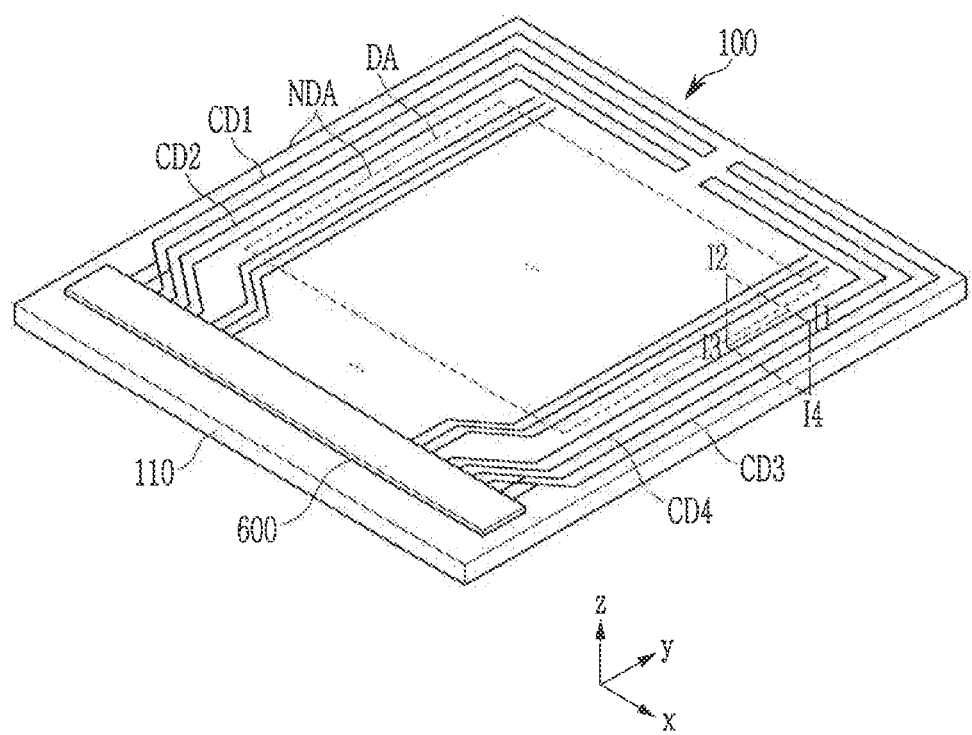
FIG. 1 illustrates a perspective view of a display device according to an exemplary embodiment of the present invention.

Hereinafter, exemplary embodiments of the present invention will be described more fully with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thicknesses of layers, films, panels, regions, etc., may be exaggerated for clarity.

It will be understood that when an element such as a layer, film, region, or substrate is referred to as being "on" another element, it can be directly on the other element or intervening elements may also be present.

Figure 2:
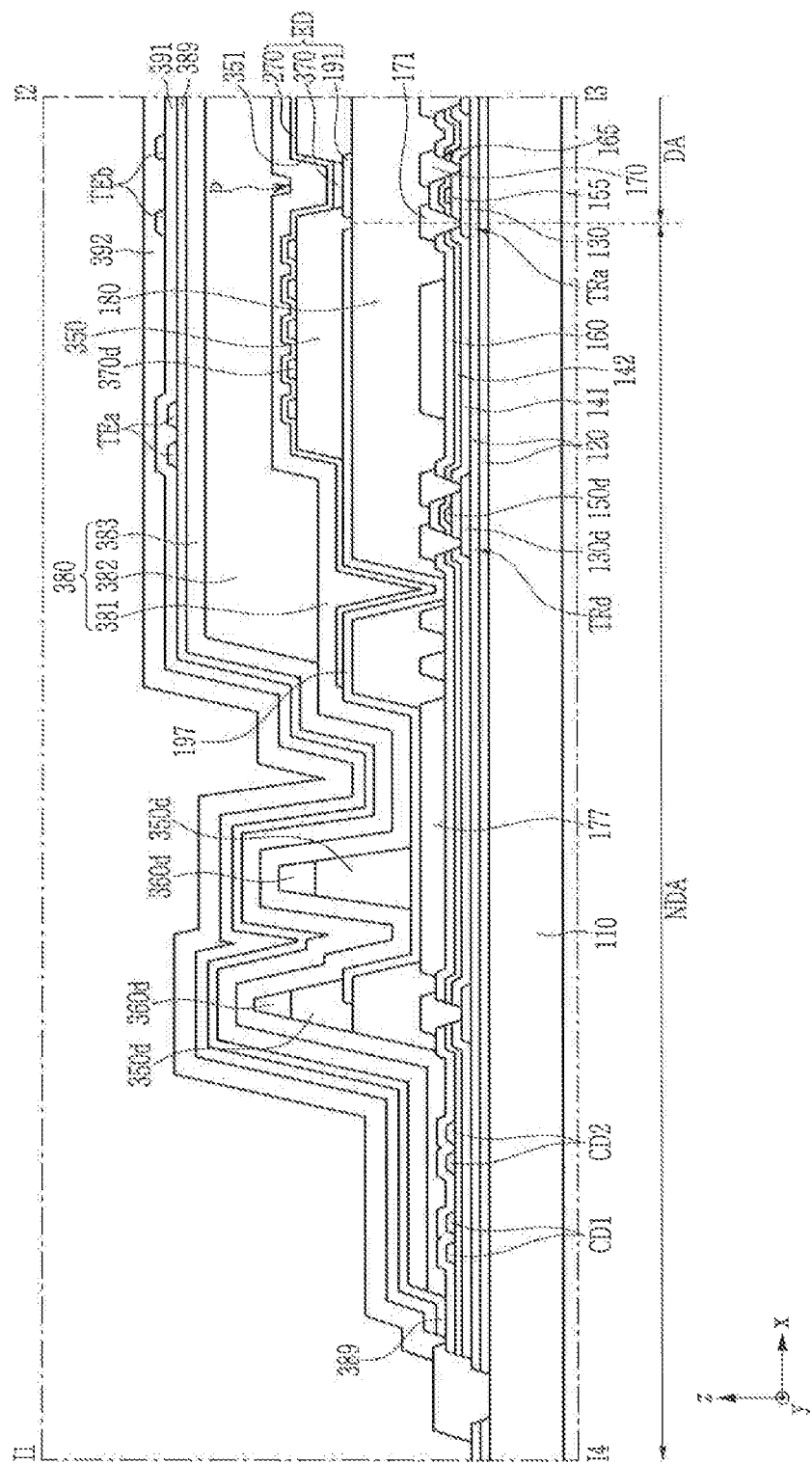
FIG. 2 illustrates a cross-sectional view taken along line I1 to I4 of the display device shown in FIG. 1.

First, a display device according to an exemplary embodiment of the present invention will be described with reference to FIG. 1 and FIG. 2. FIG. 1 illustrates a perspective view of a display device according to an exemplary embodiment of the present invention, and FIG. 2 illustrates a cross-sectional view taken along line I1 to I4 of the display device shown in FIG. 1.

Referring to FIG. 1, a display device 100 according to an exemplary embodiment of the present invention includes a display area DA for displaying an image, a substrate 110 including a peripheral area NDA peripheral to the display area DA, and a driving circuit portion 600 disposed on the substrate 110. The peripheral area NDA may include elements and/or signal lines for generating and/or transmitting various signals applied to the display area DA.

The substrate 110 is an insulating substrate including glass, a polymer, or stainless steel. The substrate 110 may be flexible, stretchable, foldable, bendable, or rollable. In the case that the substrate 110 is flexible, stretchable, foldable, bendable, or rollable, the display device 100 may be entirely flexible, stretchable, foldable, bendable, or reliable. For example, the substrate 110 may have be a flexible film including a resin such as a polyimide.

Although the peripheral area NDA is shown as surrounding the display area. DA in FIG. 1, the peripheral area NDA may be disposed on one or two sides of the display area DA, but is not limited thereto.

A plurality of pixels and signal lines (for example, data lines and gate lines) for applying signals to drive the plurality of pixels may be disposed in the display area DA.

Crack detecting lines CD1, CD2, CD3, and CD4, and the driving circuit portion 600 may be disposed in the peripheral area NDA. The driving circuit portion 600 may be used to detect defects of the crack detecting lines CD1, CD2, CD3, and CD4 and to drive the plurality of pixels. Although a pixel may not be disposed in the peripheral area NDA, a dummy pixel for measuring deterioration of the pixels or for driving a deteriorated pixel may be disposed therein, but the present invention is not limited thereto.

The driving circuit portion 600 may be bonded to the substrate 110 by a chip on glass process or a chip on plastic process. Alternatively, the driving circuit portion 600 may be simultaneously formed with the data lines, the gate lines, and the pixels by an amorphous silicon thin film transistor (TFT) gate driver (ASG) method, an oxide semiconductor TFT gate driver (OSG) method, a gate driver in panel (GIP) method, or the like. The driving circuit portion 600 is mounted on a tape carrier package or a flexible film, and the tape carrier package or the flexible film on which the driving circuit portion 600 is mounted may be bonded to the substrate 110 by a tape automated bonding (TAB) process.

A sectional structure of the display device 100 will be described with reference to FIGS. 1 and 2.

Referring to FIG. 2, a barrier layer 120 may be disposed on the substrate 110. As shown in FIG. 2, the barrier layer 120 may include a plurality of layers, or may be a single layer.

An active pattern is disposed on the barrier layer 120. The active pattern may include an active pattern 130 disposed in the display area DA and an active pattern 130d disposed in the peripheral area NDA. Each of the active patterns 130 and 130d may include a source region and a drain region, and a channel region disposed therebetween. The active pattern may include amorphous silicon, polycrystalline silicon, an oxide semiconductor, or the like.

A first insulating layer 141 may be disposed on the active patterns 130 and 130d, and a first conductive layer may be disposed on the first insulating layer 141. The first conductive layer may include a conductor 155 that overlaps the active pattern 130 disposed in the display area DA, a conductor 150d that overlaps the active pattern 130d disposed in the peripheral area NDA, and the plurality of gate lines.

The active pattern 130 and the conductor 155 that overlaps the active pattern 130 may form a transistor TRa, and the active pattern 130d and the conductor 150d that overlaps the active pattern 130d may form a transistor TRd. The transistor TRa may function as a switching element included in a pixel P disposed in the display area DA, and the transistor TRd may function as a switching element included, in a gate driving portion.

A second insulating layer 142 may be disposed on the first conductive layer and the first insulating layer 141, and a second conductive layer may be disposed on the second insulating layer 142.

A third insulating layer 160 may be disposed on the second conductive layer and the second insulating layer 142.

At least one of the first insulating layer 141, the second insulating layer 142 and the third insulating layer 160 may include an inorganic insulating material and/or an organic insulating material such as a silicon nitride (SiNx), a silicon oxide (SiOx), and a silicon oxynitride (SiON).

The first insulating layer 141, the second insulating layer 142 and the third insulating layer 160 may include a contact hole 165 disposed on the source and/or drain regions of the transistors TRa and TRd.

A third conductive layer may be disposed on the third insulating layer 160. The third conductive layer may include a conductor 170 connected to the source region or the drain region of the transistors TRa and TRd through the contact hole 165, a voltage transmitting line 177, and a data line 171. The voltage transmitting line 177 may be disposed in the peripheral area NDA, and may transmit a constant voltage such as a second power supply voltage.

At least one of the first conductive layer, the second conductive layer, and the third conductive layer may include at least one of the crack detecting lines CD1 and CD2. For example, both of the crack detecting lines CD1 and CD2 may be included in one of the first conductive layer, the second conductive layer, and the third conductive layer. In the alternative, one of the crack detecting lines CD1 and CD2 may be included in one of the first conductive layer, the second conductive layer, and the third conductive layer, and the other of the crack detecting lines CD1 and CD2 may be included in another of the first conductive layer, the second conductive layer, and the third conductive layer, but the present invention is not limited thereto.

At least one of the first conductive layer, the second conductive layer, and the third conductive layer may include a conductive material such as copper (Cu), aluminum (Al), molybdenum (Mo), titanium (Ti), tantalum (Ta), an alloy thereof, and the like. A passivation layer 180 is disposed on the third conductive layer and the third insulating layer 160. The passivation layer 180 may include an inorganic insulating material and/or an organic insulating material such as a polyacrylic resin, a polyimide resin, etc., and an upper surface of the passivation layer 180 may be substantially flat. The passivation layer 180 may expose some of the voltage transmitting line 177 disposed in the peripheral area NDA.

A pixel electrode 191 and a connecting member 197 are disposed on the passivation layer 180. The pixel electrode 191 may correspond to each pixel P in the display area DA, and the connecting member 197 may be disposed in the peripheral area NDA. The pixel electrode 191 and the connecting member 197 may, be formed of the same material in the same process. For example, the pixel electrode 191 and the connecting member 197 may be formed by forming a conductive layer on the passivation layer 180, and then, patterning the conductive layer through a photolithography process. The connecting member 197 is connected to the voltage transmitting line 177 that is not covered by the passivation layer 180.

The pixel electrode 191 and the connecting member 197 may include a reflective conductive material, a semi-transmissive conductive material, or a transparent conductive material. For example, the pixel electrode 191 and the connecting member 197 may include a transparent conductive material such as an indium tin oxide (ITO), an indium zinc oxide (IZO), lithium (Li), calcium (Ca), aluminum (Al), magnesium (Mg), and gold (Au).

A pixel defining layer 350 is disposed on the passivation layer 180, the pixel electrode 191, and the connecting member 197. The pixel defining layer 350 may be provided with an opening 351 formed on the pixel electrode 191, and may further include at least one dam portion 350d disposed in the peripheral area. NDA. The dam portion 350d may extend to be parallel to an edge of the substrate 110 in a plan view. A spacer 360d may be further disposed on the dam portion 350d.

Still referring to FIG. 2, at least one of the crack detecting lines CD1 and CD2 may be disposed in a region far from the display area DA by the dam portion 350d, but is not limited thereto. In addition, at least one of the crack detecting lines CD1 and CD2 may be disposed to be closer to the display region. DA than another one of the crack detecting lines CD1 and CD2.

The connecting member 197 includes a portion that is not covered by the pixel defining layer 350.

The pixel defining layer 350 may include a photosensitive material such as a polyacrylic resin or a polyimide resin.

A light emitting layer 370 is disposed on the pixel electrode 191. The light emitting layer 370 may include a portion disposed inside the opening 351 of the pixel defining layer 350. The light emitting layer 370 may further include at least one dummy light emitting layer 370d disposed in the peripheral area NDA and disposed on the pixel defining layer 350. The light emitting layer 370 may include an organic light emitting material or an inorganic light emitting material.

A common electrode 270 is disposed on the light emitting layer 370. The common electrode 270 may be formed on the pixel defining layer 350 and be continuously formed over the plurality of pixels P. The common electrode 270 may be physically and electrically connected to the connecting member 197 in the peripheral area. NDA to receive the second power supply voltage. The common electrode 270 may include a conductive transparent material.

The pixel electrode 191, the light emitting layer 370, and the common electrode 270 of each pixel P together form a light emitting diode ED, and one of the pixel electrode 191 and the common electrode 270 becomes a cathode and the other becomes an anode of the light emitting diode ED.

An encapsulation portion 380 for protecting and sealing the light emitting diode ED may be disposed on the common electrode 270. The encapsulation portion 380 includes at least one inorganic layer 381 or 383 and at least one organic layer 382. The at least one inorganic layer 381 or 383 and the at least one organic layer 382 may be alternately stacked. The organic layer 382 includes an organic material and may have a planarizing property. The inorganic layers 381 and 383 may include inorganic materials such as an aluminum oxide (AlOx), a silicon oxide (SiOx), a silicon nitride (SiNx), and silicon oxynitride (SiON).

A planar area of the inorganic layers 381 and 383 is wider than that of the organic layer 382, and thus, the two inorganic layers 381 and 383 may contact each other in the peripheral area NDA. The lowest inorganic layer 381 of the inorganic layers 381 and 383 may contact an upper surface of the third insulating layer 160 in the peripheral area NDA, but is not limited thereto.

An edge of the organic layer 382 included in the encapsulation portion 380 may be disposed between the dam portion 350d and the display area DA. The dam portion 350d may prevent an organic material from flowing out when the organic layer 382 of the encapsulation portion 380 is formed.

A buffer layer 389 including an inorganic insulating material and/or an organic insulating material may be disposed on the encapsulation portion 380. The buffer layer 389 may be omitted.

A fourth conductive layer may be disposed on the buffer layer 389. The fourth conductive layer may include a first touch conductor TEa. A first touch insulating layer 391 may be disposed on the fourth conductive layer, and a fifth conductive layer may be disposed on the first touch insulating layer 391. The fifth conductive layer may include a second touch conductor TEb. A second touch insulating layer 392 may be disposed on the fifth conductive layer. The first touch conductor TEa and the second touch conductor TEb form a capacitive touch sensor, and may sense touch information such as a touch or a touch position when an external object is in contact therewith.

Hereinafter, a display device according to an exemplary embodiment of the present invention will be described with reference to FIG. 3.

Figure 3:
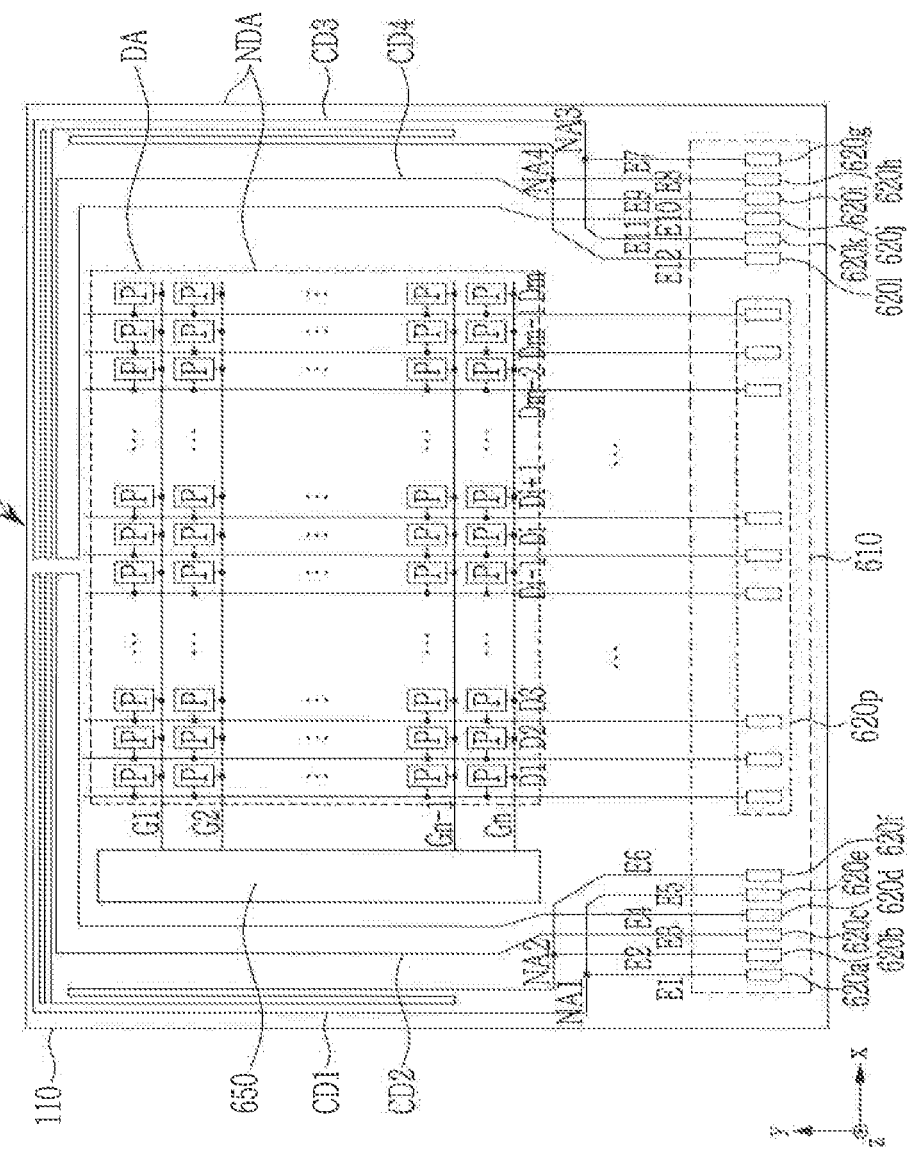
FIG. 3 illustrates a layout view of a display device according to an exemplary embodiment of the present invention.

FIG. 3 illustrates a layout view of a display device 100a according to an exemplary embodiment of the present invention.

As shown in FIG. 3, the display area DA of the substrate 110 includes a plurality of pixels P, and a plurality of data lines D1 to Dm and gate lines G1 to Gn connected to the plurality of pixels P. An individual pixel P is disposed in the display area DA and may be a minimum unit for displaying an image.

Crack detecting lines CD1, CD2, CD3, and CD4, pads 620a to 620I connected to the crack detecting lines CD1, CD2, CD3, and CD4, data pads 620p connected to the data lines D1 to Dm, and a gate driver 650, may be disposed in the peripheral area NDA of the substrate 110.

The pads 620a to 620I and the data pads 620p may be disposed in a pad area 610 in which a driving integrated circuit (IC) (e.g., a data driving IC) is disposed.

Each of the crack detecting lines CD1, CD2, CD3, and CD4 may be disposed in the peripheral area NDA outside the display area DA. Each of the crack detecting lines CD1, CD2, CD3, and CD4 may be a wire that goes around the outside of the display area DA. For example, the crack detecting lines CD1 and CD2 may be disposed outside and to the left of the display area DA, and the crack detecting lines CD3 and CD4 may be disposed outside and to the right of the display area DA. For example, the crack detecting lines CD1 and CD2 may be disposed at the left and top outer sides of the display area DA, and the crack detecting lines CD3 and CD4 may be disposed at the right and top outer sides of the display area DA.

Hereinafter, the crack detecting lines CD1 and CD2 disposed at the left outer side of the display area DA among the crack detecting lines CD1, CD2, CD3, and CD4 will be described as an example. Descriptions of the right outer side crack detecting lines CD3 and CD4 are substantially the same as those of the left outer side crack detecting lines CD1 and CD2, so certain descriptions thereof may be omitted.

The crack detecting line CD1 may be connected to the pads 620a, 620b, 620e, and 620f. For example, one side of the crack detecting line CD1 is connected to a wire E1 connected to the pad 620a and to a wire E5 connected to the pad 620e at a node NA1. In addition, the other side of the crack detecting line CD1 is connected to a wire E2 connected to the pad 620b and to a wire E6 connected to the pad 620f at a node NA2. The nodes NA1 and NA2 may be disposed outside the pad area 610.

The crack detecting line CD2 may be connected to the pads 620c and 620d. For example, one side of the crack detecting line CD2 is connected to a wire E3 connected to the pad 620c. The other side of the crack detecting line CD2 is connected to a wire E4 connected to the pad 620d.

Further, at the left side of the substrate 110 shown in FIG. 3, the crack detecting line CD1 and the crack detecting line CD2 may be disposed father from the display area DA than the gate driver 650.

The crack detecting line CD3 may be connected to the pads 620g, 620h, 620k, and 620I. For example, one side of the crack detecting line CD3 is connected to a wire E7 connected to the pad 620g and to a wire E11 connected to the pad 620k at a node NA3. En addition, the other side of the crack detecting line CD3 is connected to a wire E8 connected to the pad 620h and to a wire E12 connected to the pad 620I at a node NA4.

The crack detecting line CD4 may be connected to the pads 620i and 620j. For example, one side of the crack detecting line CD4 is connected to a wire E9 connected to the pad 620i. The other side of the crack detecting line CD4 is connected to a wire E10 connected to the pad 620j.

The driving circuit portion (600 of FIG. 1) includes a data driver connected to the data pads 620p connected to the plurality of data lines D1 to Dm and supplying a data voltage, and the gate driver 650 for supplying a gate signal to the plurality of gate lines G1 to Gn. In FIG. 3, the gate driver 650 is formed in the substrate 110 by an ASG method or a GIP method, and that the data driver is attached to the substrate as a separate IC.

The data driver may be connected to the pads 620a to 620I for supplying a voltage and/or current used for crack testing to the crack detecting lines CD1, CD2, CD3, and CD4. Alternatively, a separate crack testing IC other than the data driver may be connected to the pads 620a to 620I for supplying the voltage and/or current used for crack testing to the crack detecting lines CD1, CD2, CD3, and CD4. Hereinafter, it will be described that the data driver is connected to the pads 620a to 620I and the data pads 620p.

In FIG. 3, although it is described that the gate driver 650 is disposed on the left side of the peripheral area NDA and the data driver is disposed on a lower portion of the peripheral area NDA, the arrangement of the signal lines and the drivers in the peripheral area NDA is not limited thereto.

A connection relationship between the crack testing portion in the data driver and the crack detecting line CD1 will be described in detail with reference to FIG. 4.

Figure 4:
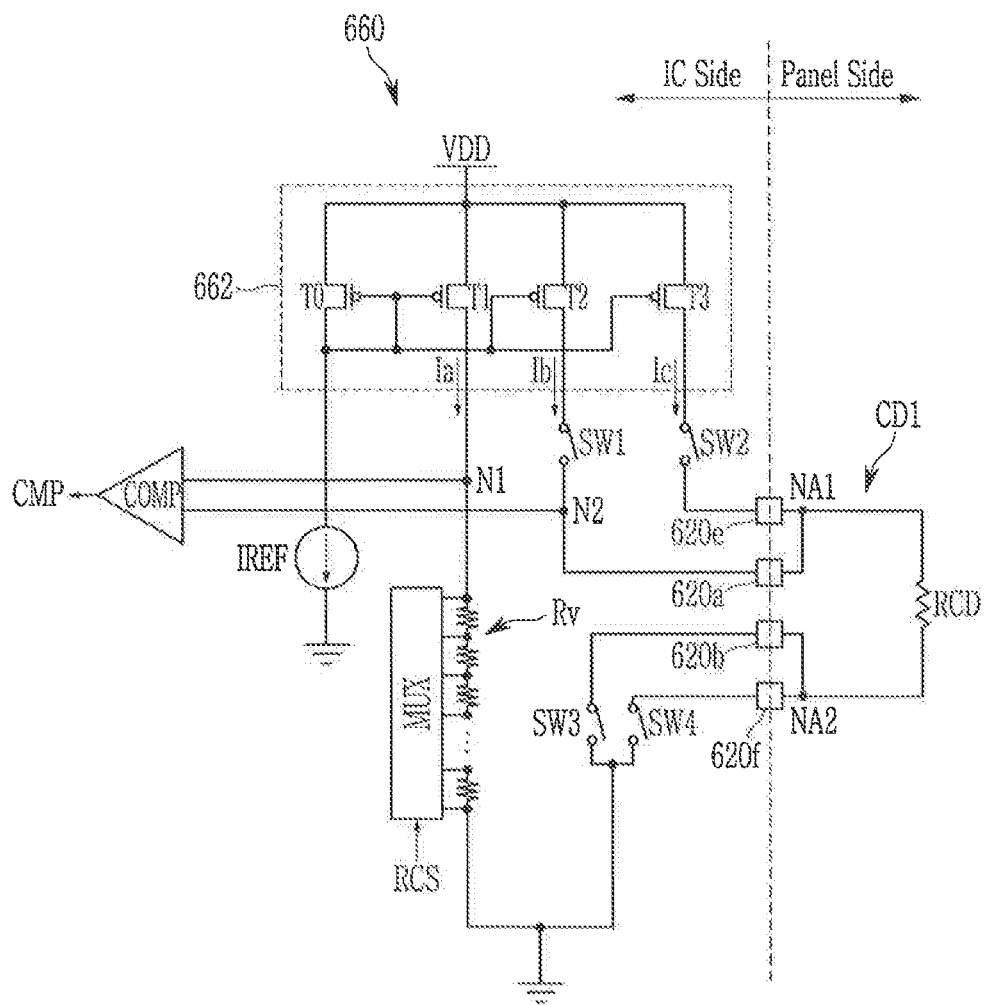
FIG. 4 schematically illustrates a crack detecting line of a display device according to an exemplary embodiment of the present invention and a crack testing portion in an integrated circuit (IC) of the display device.

FIG. 4 schematically illustrates a crack detecting line of a display device according to an exemplary embodiment of the present invention, and a crack testing portion 660 in an IC of the display device. In FIG. 4, the crack detecting line CD1 connected to the pads 620a, 620b, 620e, and 620f in a display panel is shown as a crack detecting line resistor RCD.

The crack testing portion 660 is connected to the pads 620a, 620b, 620e, and 620f. The crack testing portion 660 may be connected to ends of the crack detecting line CD1 through the pads 620a and 620b, or may be connected to the ends of the crack detecting line CD1 through the pads 620e and 620f. The crack testing portion 660 may include a current source IREF, switches SW1, SW2, SW3, and SW4, a current regulator 662, a comparator COMP, and a variable resistor Rv. The variable resistor Rv may include a plurality of resistors connected to a multiplexer MUX.

The switches SW1 and SW2 operate so that either the pad 620a or the pad 620e is connected to the current regulator 662. The switches SW3 and SW4 operate so that either the pad 620b or the pad 620f is connected to the current regulator 662.

The current regulator 662 may output a current so that a current flowing through the pads 620a and 620b and a current flowing to the crack detecting line CD1 through the pads 620e and 620f are different.

For example, the current regulator 662 may be configured as a current mirror. The current regulator 662 includes a plurality of transistors T0, T1, T2, and T3. A drain of each of the plurality of transistors T0, T1, T2, and T3 is connected to a power supply voltage VDD. A gate of each of the plurality of transistors T0, T1, T2, and T3 is connected to a source of the transistor T0. A source of the transistor T0 is connected to the current source IREF. A source of the transistor T1 is connected to the variable resistor Rv. A source of the transistor T2 is connected to the switch SW1. A source of the transistor T3 is connected to the switch SW2.

In the current mirror, to satisfy Ia=Ib, channel widths (e.g., W0, W1 and W2) of the transistor T0, the transistor T1, and the transistor T2 may be designed so that the following Equation 1 is satisfied.

$$W0 = W1 = W2 \quad \text{(Equation 1)}$$

To satisfy Ib=k×Ic (k is a positive number), the channel widths of the transistors T0 and T3 may be designed so that the following Equation 2 is satisfied.

$$W3 = \frac{1}{k} \times W0 \quad \text{(Equation 2)}$$

Here, it is assumed that channel lengths of all the transistors T0, T1, T2, and T3 are the same.

In the embodiments described above, it is described that when the channel lengths of all the transistors T0, T1, T2, and T3 are the same, the channel widths of the transistors T0, T1, and T2 are equal to each other, and the channel width of the transistor T3 is k times that of the transistor T0. The channel lengths or the channel widths of the above-described transistors may be variously changed to perform a current mirroring operation.

In the above embodiments, to satisfy Ib=k×Ic, it is described that the current mirror is used to adjust the current, but the present invention is not limited thereto.

When the current Ib or Ic is applied to the crack detecting line CD1, a resistance control signal RCS may be supplied so that a resistance value of the variable resistor Rv is changed within a predetermined range (for example, 2 kΩ to 511 kΩ).

The comparator COMP compares a voltage of a node N2 by the crack detecting line resistor RCD of the crack detecting line CD1 with a voltage of a node N1 by the variable resistor Rv, and then, outputs the compared result value CMP. The compared result value CMP may be converted through an analog-to-digital converter (ADC). By tuning the value of the variable resistor Rv according to the compared result value CMP, the resistance value of the crack detecting line CD1 may be more accurately measured.

When a significant crack occurs in the display device 100a and the crack detecting line CD1 is cut, the resistance value of the variable resistor Rv should be changed within a wide resistance range to measure the resistance value of the cut crack detecting line CD1. However, there is a limitation on the number of bits representing the resistance value of the variable resistor Rv.

For example, when the variable resistor Rv is a ladder resistor including 2 kΩ, 4 kΩ, 8 kΩ, ..., 256 kΩ, the crack testing portion 660 may represent a resistance value using 8 bits. In other words, the crack testing portion 660 may measure whether or not the crack detecting line CD1 has a resistance value of 2 kΩ to 510 kΩ. To measure a larger resistance value, resistors such as 512 kΩ and 1024 kΩ should be used. Then, the number of bits indicating a resistance value is increased to 9 bits and 10 bits. The increase of the number of the bits causes inefficiency and a cost increase with respect to data processing.

According to the present embodiment, by applying different currents to the crack detecting line CD1 using the two input pads 620a and 620e and the two output pads 620b and 620f connected to the crack detecting line CD1, a resistance value of the crack detecting line CD1 at which a crack occurs may be detected without increasing the number of bits.

When the switches SW1 and SW3 are turned on, a current satisfying Ia=Ib is applied to the crack detecting line CD1. When the current Ib is applied to the crack detecting line CD1, a voltage at the node N2 is Ia×RCD. In this case, the voltage at the node N1 is Ia=Rv. Since the comparator COMP compares the voltage at the node N2 with the voltage at the node N1, the resistance of the crack detecting line resistor RCD may be measured with Rv.

When the switches SW2 and SW4 are turned on, a current satisfying Ia=Ib=k×Ic is applied to the crack detecting line CD1. Here, it is assumed that k is 6. When the current Ic is applied to the crack detecting line CD1, the voltage at the node N2 may be calculated by $$\frac{1}{6} \times Ia \times RCD.$$

In this case, the voltage at the node N1 is Ia×Rv. Since the comparator COMP compares the voltage at the node N2 with the voltage at the node N1, the resistance of the crack detecting line resistor RCD may be measured with 6×Rv. In other words, even when the resistance of the crack detecting line resistor RCD is six times a resistance range measurable by using the variable resistor Rv, the resistance of the crack detecting line resistor RCD may be measured.

The crack testing portion 660 may test whether the resistance of the crack detecting line CD1 is within 12 kΩ to 3060 kΩ using 8 bits. The crack testing portion 660 may detect the range of the resistance of the crack detecting line CD1 higher than 510 kΩ. For example, the crack testing portion 660 can determine whether the resistance of the crack detecting line CD1 falls with a range of 512 kΩ to 3060 kΩ. Therefore, even when the crack detecting line CD1 is cut or a large defect occurs in the crack detecting line CD1, the crack testing portion 660 may measure the resistance value of the crack detecting line CD1.

In other words, by using the four pads 620*a*, 620*b*, 620*e*, and 620*f* connected to the crack detecting line CD1, the resistance of the crack detecting line CD1 may be detected in various resistance value ranges.

Hereinafter, a method for detecting defects in the display device 100*a* of FIG. 3 will be described with reference to FIG. 5 to FIG. 7.

Figure 5:
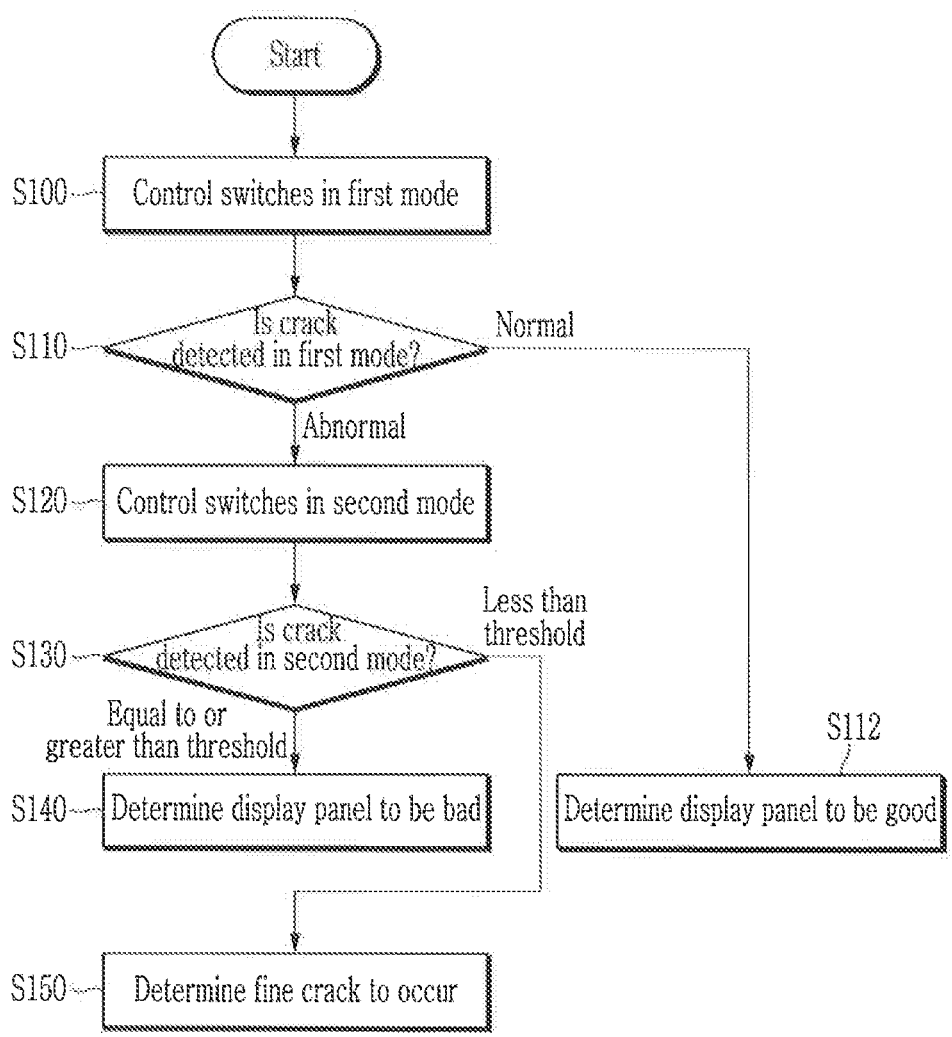
FIG. 5 illustrates a flowchart of a testing method of a display device according to an exemplary embodiment of the present invention.
Figure 6:
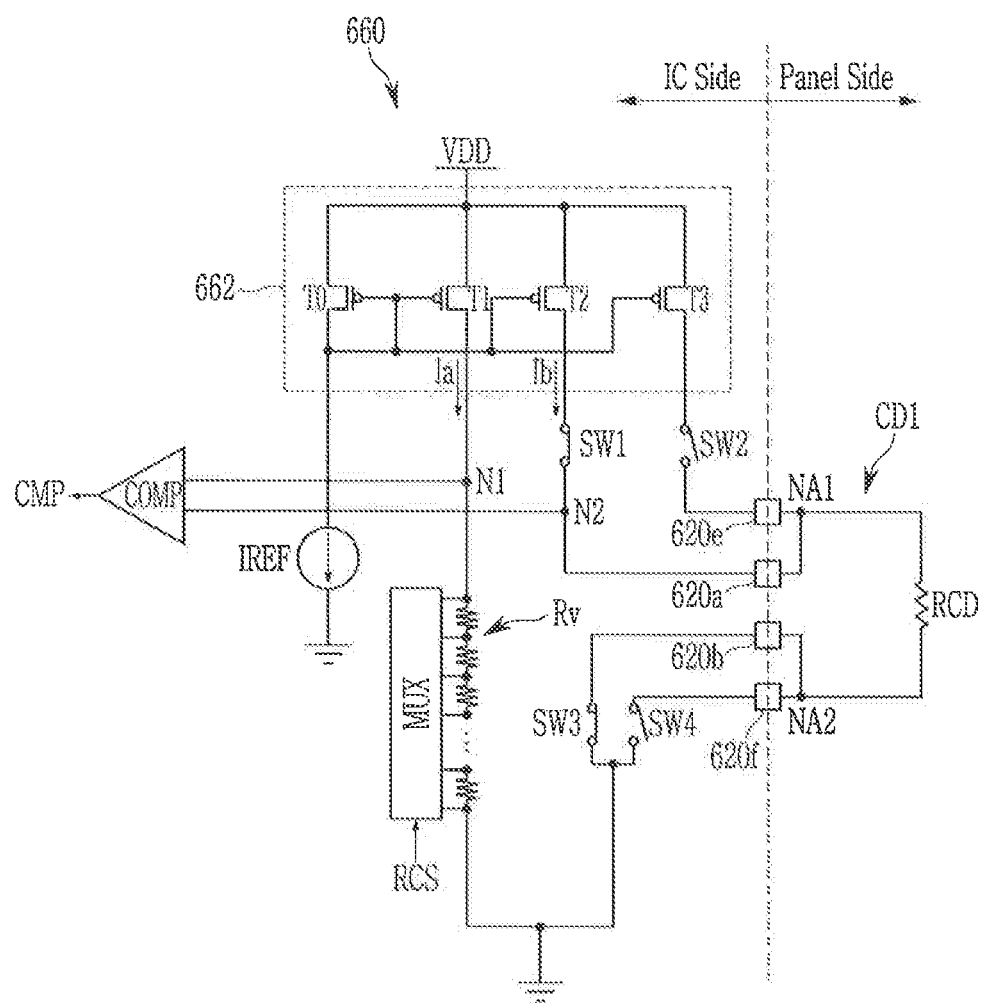
FIG. 6 and FIG. 7 illustrate cases in which a resistance of a crack detecting line is measured according to the testing method of FIG. 5.
Figure 7:
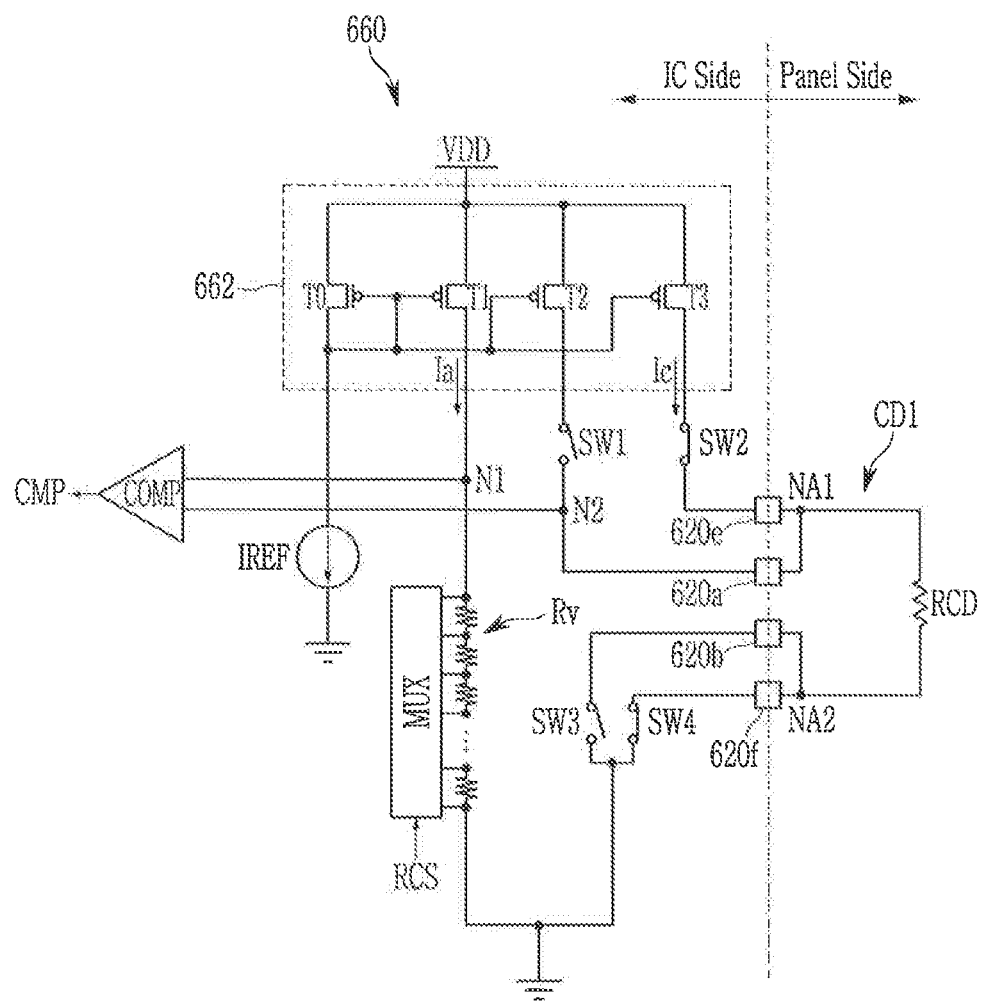

FIG. 5 illustrates a flowchart of a testing method of a display device according to an exemplary embodiment of the present invention, and FIG. 6 and FIG. 7 illustrate cases in which a resistance of a crack detecting line is measured according to the testing method of FIG. 5.

Referring to FIG. 5, the crack testing portion 660 controls the switches (e.g., SW1 to SW4) to operate in a first mode (S100). Here, the first mode is a mode for measuring the resistance of the crack detecting line CD1 within a low resistance range. As shown in FIG. 6, the switches SW1 and SW3 are turned on.

In the first mode, it is determined if a crack of the crack detecting line CD1 is detected (S110). By adjusting the value of the variable resistor Rv using the resistance control signal RCS, the resistance value of the crack detecting line CD1 may be detected.

When the resistance value of the crack detecting line CD1 is equal to or smaller than a first resistance value, it is determined that no crack is detected (S112). In other words, the display panel is determined to be good.

When the resistance value of the crack detecting line CD1 is larger than the first resistance value, the crack testing portion 660 controls the switches (e.g., SW1 to SW4) to operate in a second mode (S120). As shown in FIG. 7, the switches SW2 and SW4 are turned on.

In the second mode, it is determined if a crack of the crack detecting lite CD1 is detected (S130). By adjusting the value of the variable resistor Rv using the resistance control signal RCS, the resistance value of the crack detecting line CD1 may be detected.

When the resistance value of the crack detecting line CD1 is less than a second resistance value which is larger than the first resistance value, the crack testing portion 660 determines that fine cracks have occurred in the display panel (S150).

When the resistance value of the crack detecting line CD1 is equal to or larger than the second resistance value, the crack testing portion 660 determines that a serious crack has occurred in the display panel (S140). In other words, the display panel is determined to be bad.

Hereinafter, a display device according to another exemplary embodiment of the present invention will be described with reference to FIG. 8.

Figure 8:
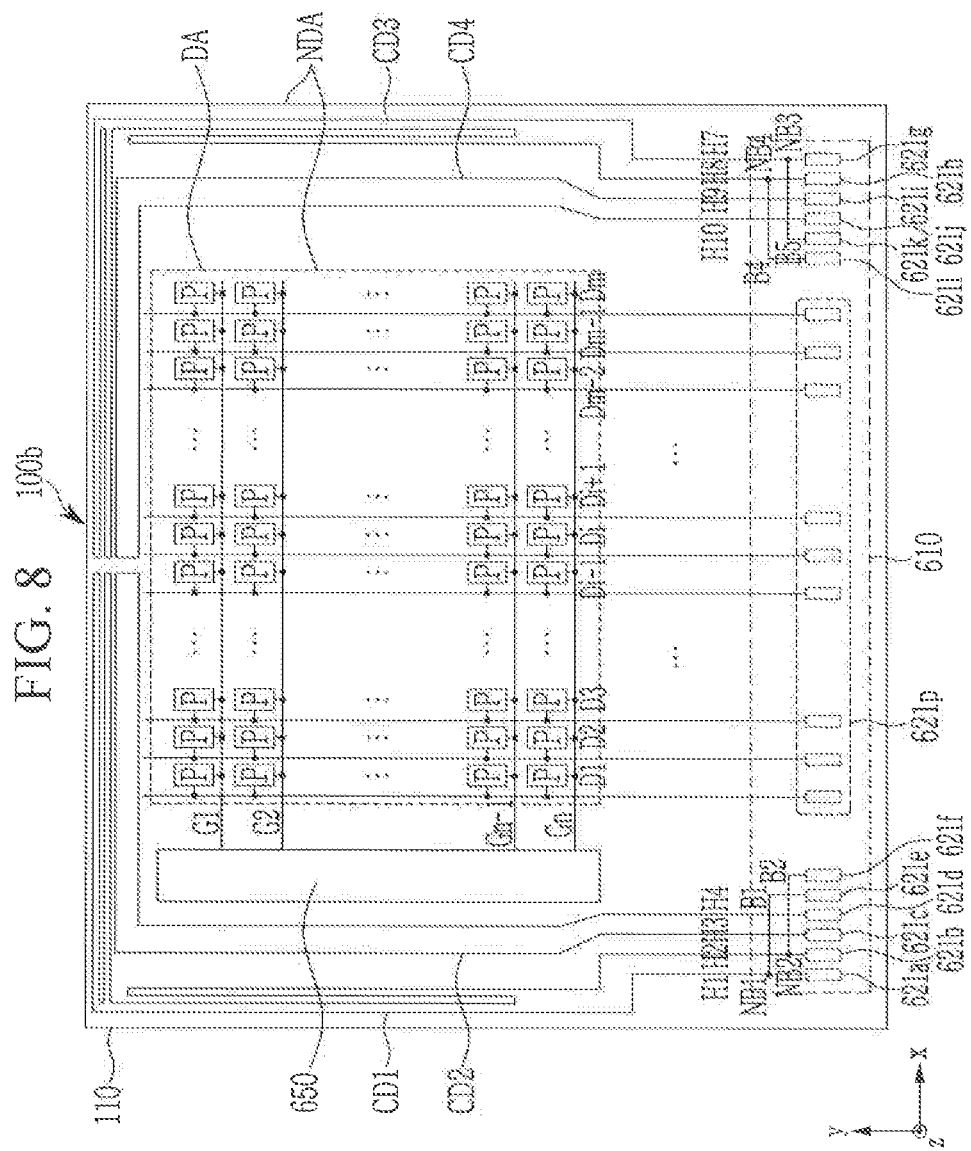
FIG. 8 illustrates a layout view of a display device according to another exemplary embodiment of the present invention.

FIG. 8 illustrates a layout view of a display device according to another exemplary embodiment of the present invention. Among the component elements of a display device 100*b* shown in FIG. 8, descriptions of the same or similar component elements to those of the display device 100*a* shown in FIG. 3 may be omitted below. In addition, the crack detecting line Cal will be described as an example of the crack detecting lines CD1, CD2, CD3, and CD4, and since the crack detecting line CD3 is the same as or similar to the crack detecting line CD1, a description of the crack detecting line CD3 may be omitted.

As shown in FIG. 8, the crack detecting line CD1 may be connected to pads 621*a*, 621*b*, 621*e*, and 621*f*. For example, one side of the crack detecting line CD1 is connected to a wire connected to the pad 621*a* and a wire B1 connected to the pad 621*e* at a node NB1. In addition, the other side of the crack detecting line CD1 is connected to a wire H2 connected to the pad 621*b* and to a wire B2 connected to the pad 621*f* at a node NB2. Here, the wires B1 and B2 and the nodes NB1 and NB2 may be disposed inside the pad area 610.

The crack detecting line CD2 is connected to pads 621*c* and 621*d* via wires H2 and H3, respectively. The crack detecting line CD4 is connected to pads 621*i* and 621*j* via wires H8 and H9, respectively. One side of the crack detecting line CD3 is connected to a wire H7 connected to the pad 621*j* and a wire B5 connected to the pad 621*k* at a node NB3. In addition, the other side of the crack detecting line CD3 is connected to a wire H8 connected to the pad 621*n* and to a wire 84 connected to the pad 621*l* at a node NB4. Data pads 621*p* may be connected to the data lines D1 to Dm.

Hereinafter, a display device according to another exemplary embodiment of the present invention will be described with reference to FIG. 9.

Figure 9:
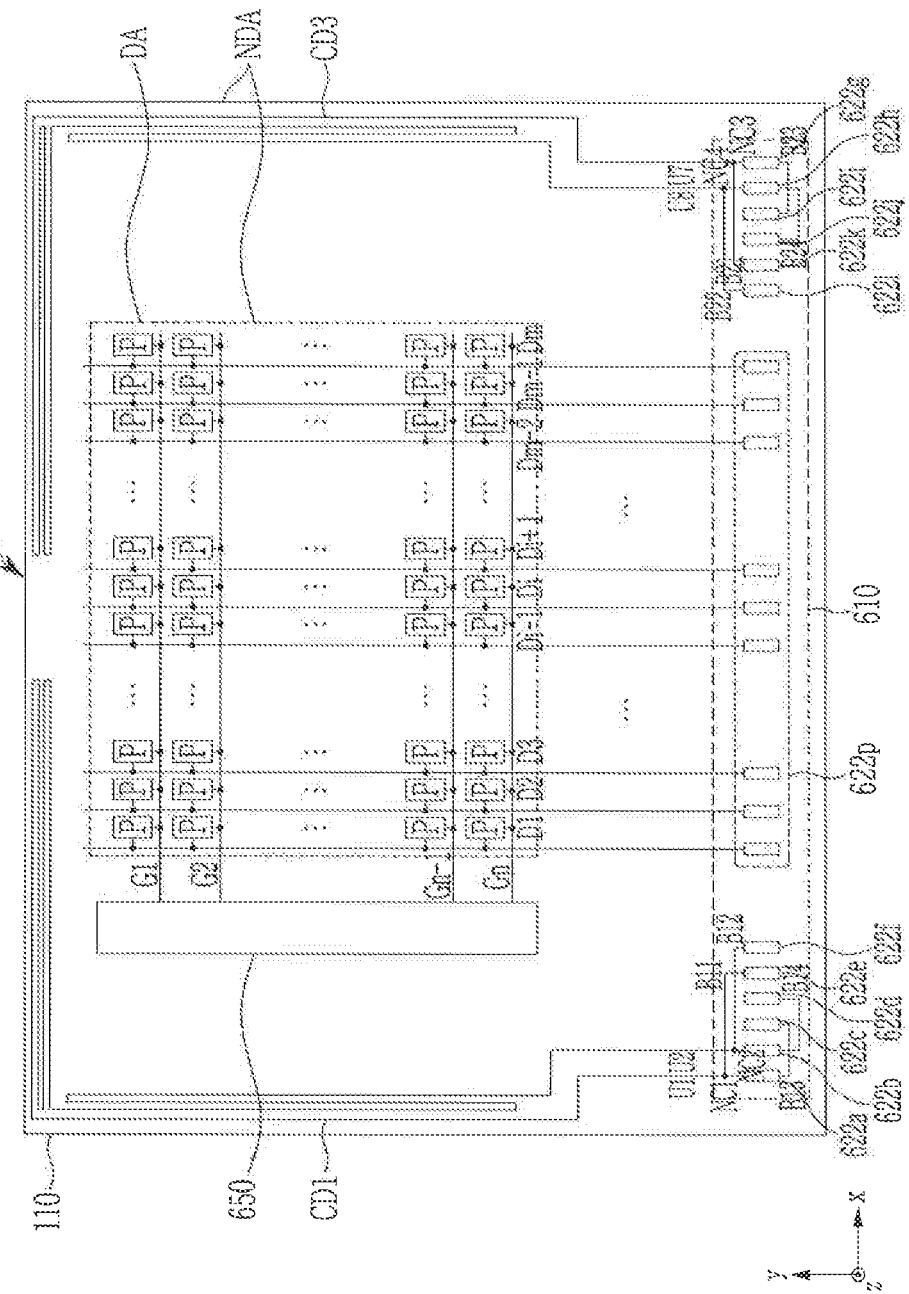
FIG. 9 illustrates a layout view of a display device according to another exemplary embodiment of the present invention.

FIG. 9 illustrates a layout view of a display device according to another exemplary embodiment of the present invention. Among the component elements of a display device 100*c* shown in FIG. 9, descriptions of the same or similar component elements to those of the display device 100*a* shown in FIG. 3 may be omitted below. In addition, the crack detecting line CD1 will be described as an example of the crack detecting lines CD1 and CD3, and since the crack detecting line CD3 is the same as or similar to the crack detecting line CD1, a description of the crack detecting line CD3 may be omitted.

Pads 622*a* to 622*l* connected to the crack detecting lines CD1 and CD3, data pads 622*p* connected to the data lines D1 to Dm, and the gate driver 650, may be disposed in the peripheral area NDA of the substrate 110.

The crack detecting line CD1 may be connected to the pads 622*a*, 622*b*, 622*c*, 622*d*, 622*e*, and 622*f*.

For example, one side of the crack detecting line CD1 is connected to a wire U1 connected to the pad 622*a* and to a wire B11 connected to the pad 622*e* at a node NC2. The pads 622*a* and 622*e* are also connected by a wire B13.

In addition, the other side of the crack detecting line CD1 is connected to a wire U2 connected to the pad 622b and to a wire B12 connected to the pad 622f at a node NC2. The pads 622b and 622d are also connected by a wire B14.

Since one crack detecting line CD1 is connected to the three input pads 622a, 622c, and 622e and the three input pads 622b, 622d, and 622f, the resistance of the crack detecting line CD1 may be measured within more various ranges of resistance by applying Ib to the pad 622a, $$\frac{1}{6} \times Ib$$

to the pad 622c, and $$\frac{1}{12} \times Ib$$

to the pad 622e.

Here, the wires B11, B12, B13, and B14 and the nodes NC1 and NC2 may be disposed inside the pad area 610.

As further shown in FIG. 9, one side of the crack detecting line CD3 is connected to a wire U7 connected to the pad 622g and to a wire B21 connected to the pad 622k at a node NC3. The pads 622g and 622i are also connected by a wire B23.

In addition, the other side of the crack detecting line CD3 is connected to a wire U8 connected to the pad 622h and to a wire B22 connected to the pad 622l at a node NC4. The pads 622h and 622j are also connected by a wire B24.

Hereinafter, a display device according to another exemplary embodiment of the present invention will be described with reference to FIG. 10 to FIG. 13.

Figure 10:
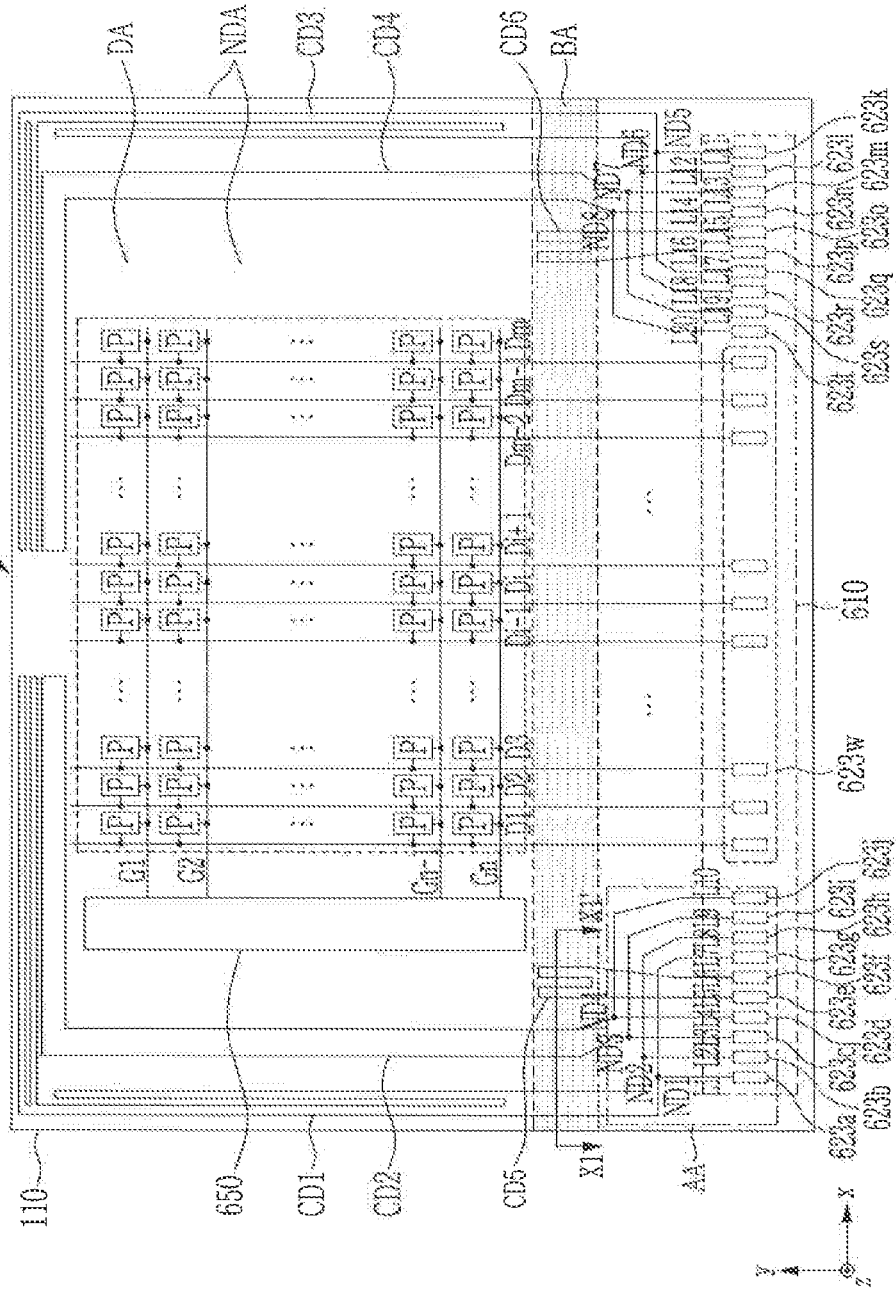
FIG. 10 illustrates a layout view of a display device according to another exemplary embodiment of the present invention.
Figure 11:
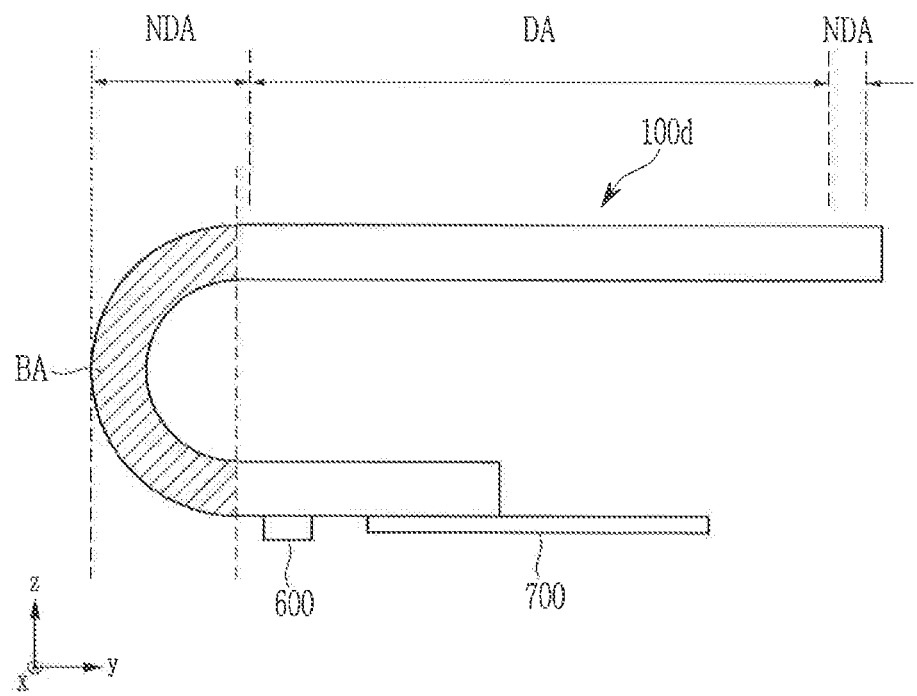
FIG. 11 illustrates a state in which the display device shown in FIG. 10 is bent in a bending area.

FIG. 10 illustrates a layout view of a display device according to another exemplary embodiment of the present invention, and FIG. 11 illustrates a state in which the display device shown in FIG. 10 is bent in a bending area.

Among the component elements of a display device 100d shown in FIG. 10, descriptions of the same or similar component elements to those of the display device 100a shown in FIG. 3 may be omitted below.

The peripheral area NDA may include a bendable area BA that may be bent. The bendable area BA may extend across the display device 100d in a direction parallel to an x direction. In FIG. 10, the bendable area BA is disposed below the display area DA in the peripheral area NDA, but the position and the number of bendable areas BA are not limited thereto. The bendable area BA includes both an area that is already bent and an area that is bendable in a subsequent process.

As shown in FIG. 11, the display device 100d may be bent in the bendable area BA, so that the peripheral area NDA disposed outside the bendable area BA may not be seen from the front due to the backward movement of the display device 100d. In other words, a portion of the peripheral area NDA that includes the driver circuit portion 600 may not be seen from the front. A plurality of wires may pass through the bendable area BA, and the plurality of wires may extend to be parallel to a y-axis direction in the bendable area BA.

When the bendable area BA of the display device 100d is bent such that the driving circuit portion 600 in the peripheral area NDA is disposed below the bendable area BA, the driving circuit portion 600 may be positioned behind the display device 100d. A printed circuit film 700 may be connected to the peripheral area NDA outside the driving circuit portion 600. The driving circuit portion 600 may be disposed between the printed circuit film 700, and the connecting region and the bendable area BA of the display device 100d.

Referring again to FIG. 10, each of the crack detecting lines CD1, CD2, CD3, CD4, CD5, and CD6 may be disposed in the peripheral area NDA outside the display area DA. Each of the crack detecting lines CD1, CD2, CD3, and CD4 may be disposed around and/or along two sides of the display area DA.

Each of the crack detecting lines CD1 and CD3 may be wires arranged in a predetermined pattern along one side of the display area DA. Here, the predetermined pattern includes a pattern in which portions of the crack detecting line CD1 extending in the y-axis direction are arranged along the x-axis direction and a pattern in which portions of the crack detecting line CD1 extending in the x-axis direction are arranged along the y-axis direction.

Each of the crack detecting lines CD2 and CD4 may be a wire arranged along sides of the display area DA. Each of the crack detecting lines CD1 and CD3 may include a wire pair in the peripheral area NDA except for the bendable area BA. In addition, each of the crack detecting lines CD1 and CD2 may be a single wire, and may be disposed to go around along a circumference of the display area DA, but the present invention is not limited thereto.

Although the crack detecting line CD1 and the crack detecting line CD2 are disposed on the same side (e.g., the left side) in the peripheral area NDA, since the areas in which they are disposed are different, it is possible to accurately detect how much a crack has penetrated toward the display area DA. For example, if the resistance of the crack detecting line CD1 is measured to be high and it is determined to be indicative of a defective crack, when the resistance of the crack detecting line CD2 is measured to be lower and it is determined that no crack has occurred, it can be seen that the crack did not deeply penetrate into the display area DA. Alternatively, when the resistances of the crack detecting lines CC1 and CD2 are both measured to be high, it can be seen that the crack has deeply penetrated into the display area DA.

Each of the crack detecting lines CD5 and CD6 may be disposed in the bendable area BA in the peripheral area NDA. The crack detecting lines CD5 and CD6 may be wires that tuning fork pattern in the bendable area BA.

Although the crack detecting line CD1 and the crack detecting line CD5 are disposed on the same side (e.g., the left side) in the peripheral area NDA, since the areas in which they are disposed are different, it is possible to more accurately detect whether a position at which the crack occurred in the display panel is within the bendable area BA or outside the bendable area BA.

Hereinafter, the crack detecting lines CD1, CD2, and CD5 disposed at the left side of the display area DA among the crack detecting lines CD1, CD2, CD3, CD4, CD5, and CD6 will be described as an example.

The crack detecting line CD1 may be connected to pads 623a, 623b, 623g, and 623h. For example, one side of the crack detecting line CD1 is connected to a wire connected to the pad 623a and to a wire L7 connected to the pad 623g at a node ND1. In addition, the other side of the crack detecting line CD1 is connected to a wire L2 connected to the pad 623b and to a wire L8 connected to the pad 623h at a node ND2. Here, the nodes ND1 and ND2 may be disposed outside the pad area 610.

The crack detecting line CD2 may be connected to pads 623c, 623d, 623i, and 623j. For example, one side of the crack detecting line CD2 is connected to a wire L3 connected to the pad 623c and to a wire L9 connected to the pad 623i at a node ND3. In addition, the other side of the crack detecting line CD2 is connected to a wire L4 connected to the pad 623d and to a wire L10 connected to the pad 623j at a node ND4. Here, the nodes ND3 and ND4 may be disposed outside the pad area 610. Although the nodes ND1, ND2, ND3 and ND4 are described as being disposed outside the pad area 610, the respective nodes ND1, ND2, ND3, and ND4 may be disposed inside or outside the pad area.

The crack detecting line CD5 may be connected to pads 632a and 632f.

The crack detecting lines CD3, CD4 and CD6 may be connected to pads 623k to 632t via lines L11 to L20. Nodes ND5 to ND8 may be connected to the crack detecting lines CD3, CD4 and CD6. Data pads 623w may be connected to the data lines D1 to Dm.

Hereinafter, cross-sectional structures of the crack detecting lines CD1, CD2, and CD5 will be described with reference to FIG. 12.

Figure 12:
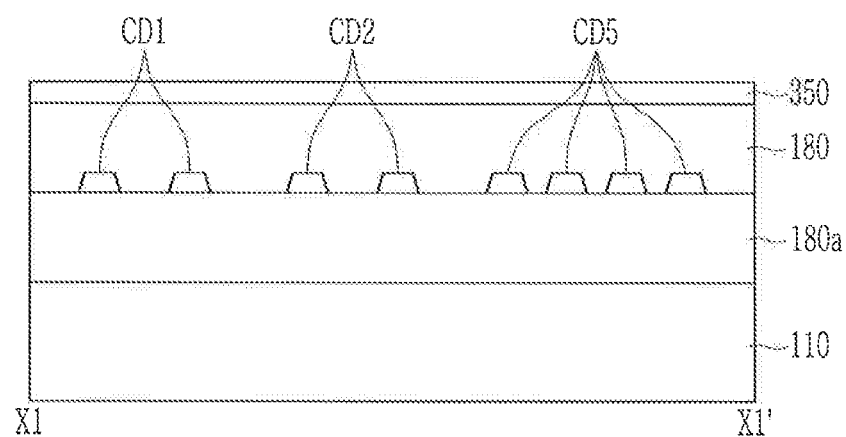
FIG. 12 illustrates a cross-sectional view taken along line X1-X1' of the display device shown in FIG. 10.

FIG. 12 illustrates a cross-sectional view taken along line X1-X1' of the display device shown in FIG. 10.

In the bendable area BA, the crack detecting lines CD1, CD2, and CD5 may be disposed in a third conductive layer in which the data line 171, the voltage transmitting line (177 in FIG. 2), and the like are disposed. In an area other than the bendable area BA, when the crack detecting lines CD1, CD2, and CD5 are disposed in a layer other than the third conductive layer, the crack detecting lines CD1, CD2, and CD5 may include at least one contact portion disposed at the upper and lower sides of the bendable area BA, and at least one contact portion located at the periphery of the bendable area BA. In addition, two portions of the crack detecting lines CD1, CD2, and CD5 disposed in different layers may be electrically connected through the contact portion. The contact portion may include the contact holes of the insulating layer disposed between the two portions disposed on the different layers.

The first insulating layer 141, the second insulating layer 142, and the third insulating layer 160 disposed below the third conductive layer in the insulating layer disposed on the substrate 110 may be removed in the bendable area BA, and instead, an insulating layer 180a may be disposed on the substrate 110. The insulating layer 180a may include an organic insulating material, and may not be present in other areas except the bendable area BA and its periphery.

Hereinafter, a specific arrangement of the crack detecting lines CD1, CD2, and CD5 and the pads 623a to 623j in the peripheral area NDA will be described with reference to FIG. 13.

Figure 13:
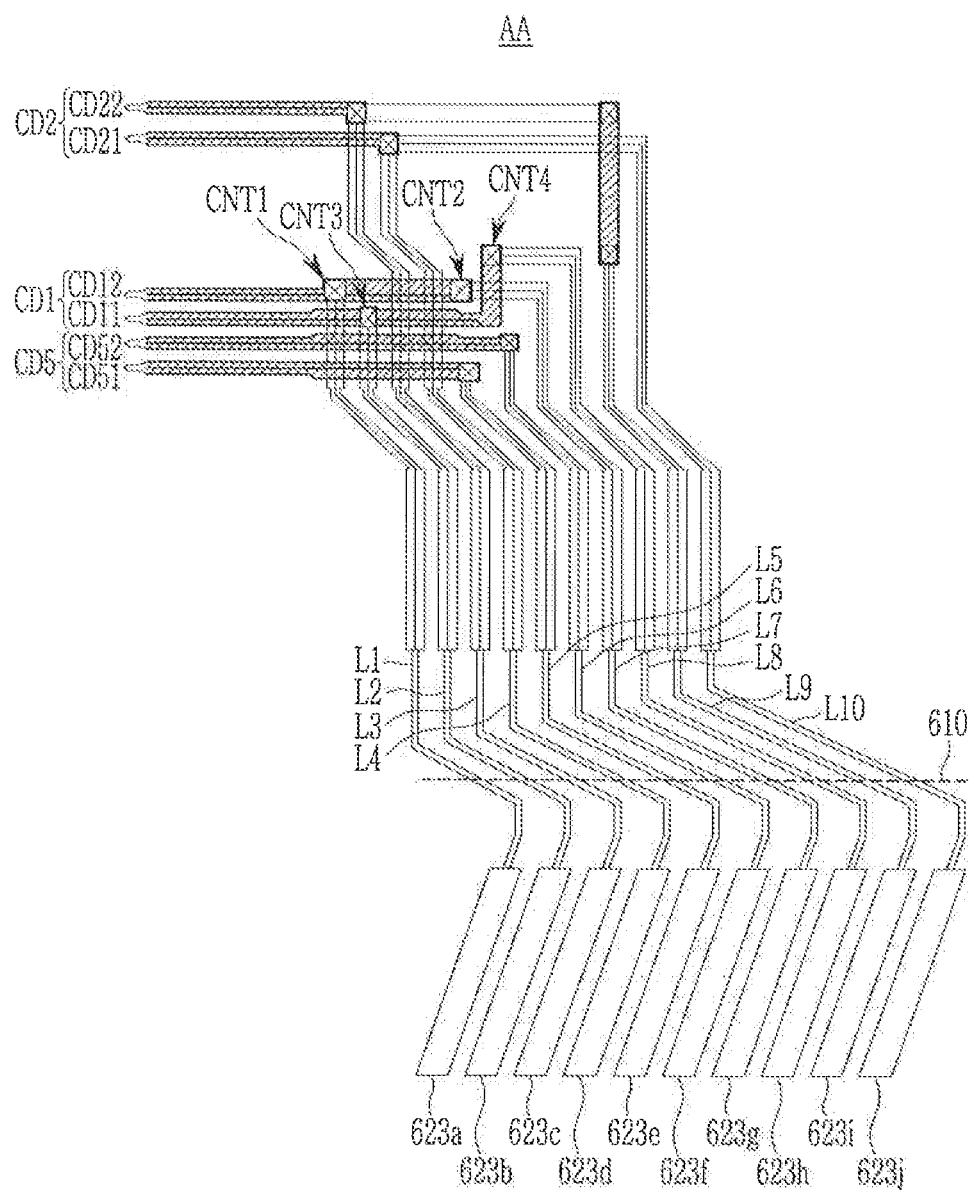
FIG. 13 illustrates a layout view of area AA of FIG. 10.

FIG. 13 illustrates a specific layout view of area AA of FIG. 10.

The pads 623a to 623j are disposed in the pad area 610. Each of the pads 623a to 623j is connected to a corresponding one of the wires L1 to L10.

The crack detecting lines CD1, CD2, and CD5 may be disposed in the third conductive layer shown in FIG. 2, and the wires L1 to L10 may be disposed in the first conductive layer shown in FIG. 2.

The wires L1 and L7 are connected to the wire CD12 of which the crack detecting line CD1 is introduced into the display panel. The wire CD12 is connected to the wire L1 through contact hole CNT1, extends in the x-axis direction, and then, is connected M the wire L7 through contact hole CNT2. As such, the wires L1 and L7 connected to the pads 623a and 623g are connected to the line CD12 of the crack detecting line CD1 in a region spaced apart from the pad area 610.

The wires L2 and L8 are connected to the wire CD11 of the crack detecting line CD1 is introduced into the pad area 610. The wire CD11 is connected to the wire L2 through contact hole CNT3, extends in the x-axis direction, and then, is connected to the wire L8 through contact hole CNT4. As such, the wires L2 and L8 connected to the pads 623b and 623h are connected to the line CD11 of the crack detecting line CD1 in a region spaced apart from the pad area 610.

The wires L3 and L9 are connected to the wire CD22 of which the crack detecting line CD2 is introduced into the display panel. The wires L4 and L10 are connected to the wire CD21 of which the crack detecting line CD2 is introduced into the pad area 610.

The wire L5 is connected to the wire CD51 of which the crack detecting line CD5 is introduced into the display panel. The wire L6 is connected to the wire CD52 of which the crack detecting line CD5 is introduced into the pad area 610.

Figure 14:
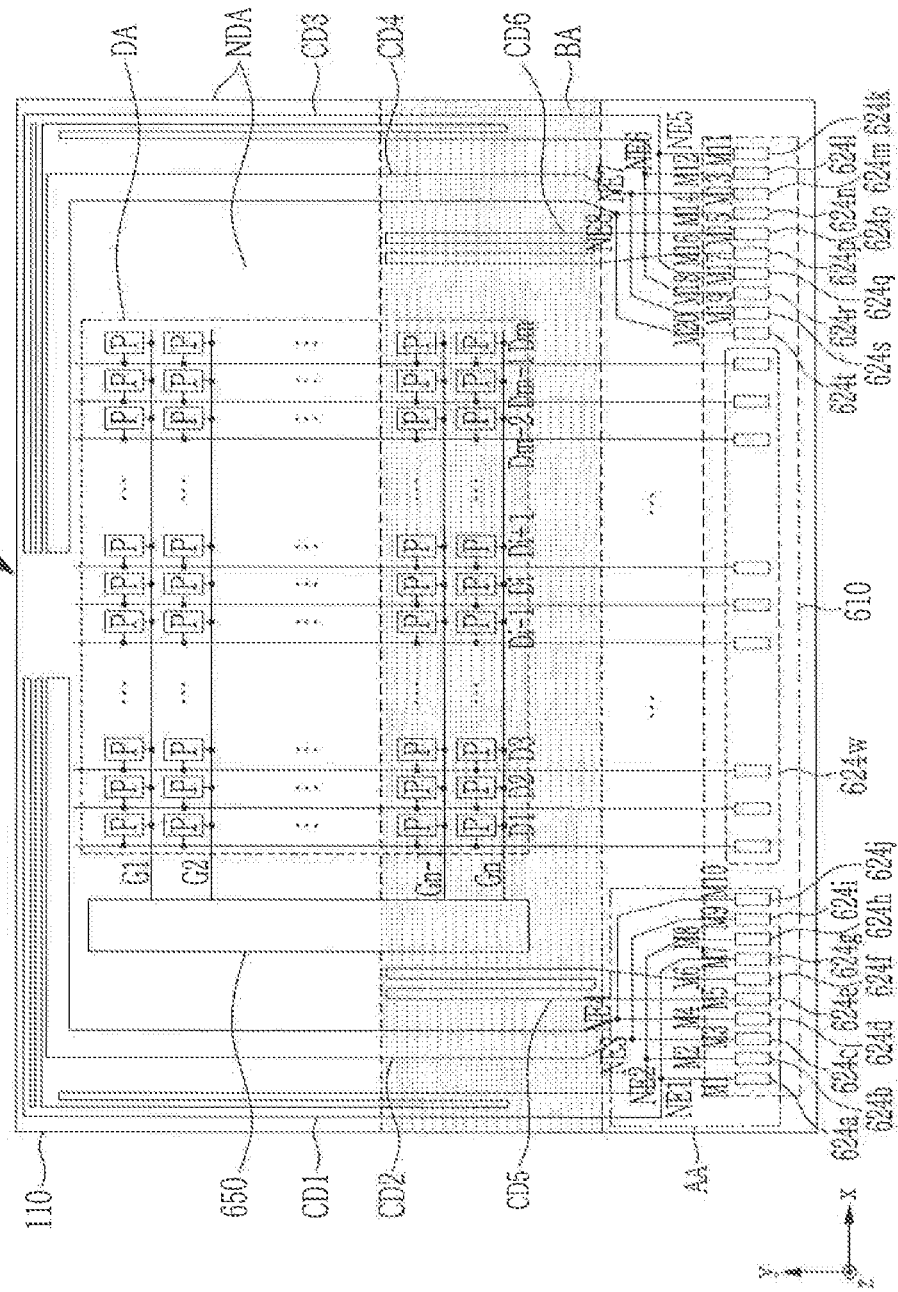
FIG. 14 illustrates a layout view of a display device according to another exemplary embodiment of the present invention.
Figure 15:
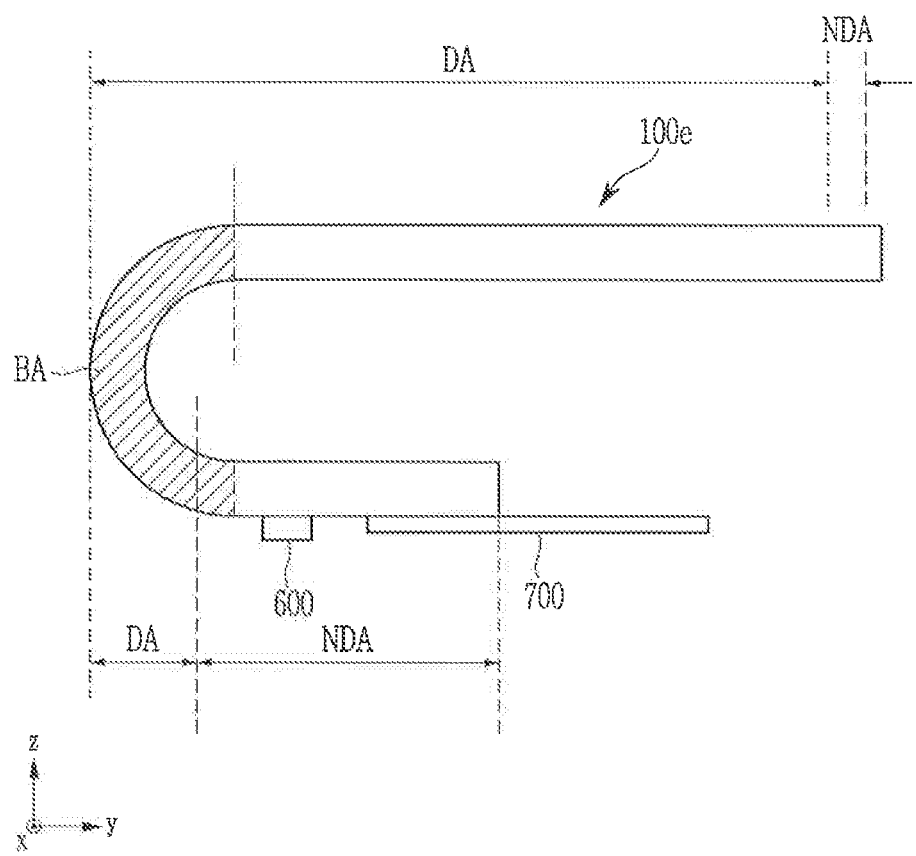
FIG. 15 illustrates a state in which the display device shown in FIG. 14 is bent in a bending area.

FIG. 14 illustrates a layout view of a display device according to another exemplary embodiment of the present invention, and FIG. 15 illustrates a state in which the display device shown in FIG. 14 is bent in a bending area.

Among the component elements of a display device 100e shown in FIG. 14, descriptions of the same or similar component elements to those of the display device 100d shown in FIG. 10 will be omitted below.

Referring to FIG. 14, the bendable area BA includes the peripheral area NDA below the display area DA and part of the display area DA. Each of the crack detecting lines CD5 and CD6 may be disposed in the peripheral area NDA in the bendable area BA. The crack detecting lines CD5 and CD6 may extend to be parallel to the y-axis direction up to the bendable area BA including the display area DA. For example, one side of the crack detecting line CD5 is connected to wire M5 connected to pad 624e, the other side of the crack detecting line CD5 is connected to wire M6 connected to pad 624f. In addition, the crack detecting line CD5 may extend to be parallel to the y-axis direction and up to an area adjacent to an upper boundary of the bendable area BA. The crack detecting lines CD5 and CD6 may have the same pattern in the bendable area BA.

As further shown in FIG. 14, the crack detecting lines CD1 and CD2 may be connected to pads 624a to 624d and pads 624g to 624j via lines M1 to M4 and lines M7 to M10. Nodes NE1 to NE4 may be connected to the crack detecting lines CD1 and CD2. In addition, crack detecting lines CD3, CD4 and CD6 may be connected to pads 624k to 624t via lines M11 to M20. Nodes NE5 to NE8 may be connected to the crack detecting lines CD3 and CD4. Data pads 624w may be connected to the data lines D1 to Dm.

As shown in FIG. 15, the display device 100e is bent in the bendable area BA. Therefore, the display area DA in the bendable area BA is also bent. An image may be displayed in the bent display area DA. The peripheral area NDA disposed outside the bendable area BA may be bent backward of the display device 100e and may not be seen from the front side. A plurality of wires may pass through the bendable area BA, and the plurality of wires may extend to be parallel to the y-axis direction in the bendable area BA.

When the bendable area BA of the display device 100e is bent in a state such that the driving circuit portion 600 is disposed in the peripheral area NDA below the bendable area BA, the driving circuit portion 600 may be positioned behind the display device 100e. The printed circuit film 700 may be connected to the peripheral area NDA outside the driving circuit portion 600. The driving circuit portion 600 may be disposed between the connecting area of the printed circuit film 700 and the display device 100e, and the bendable area BA. The display devices 100, 100a, 100b, 100c, 100d, and 100e described above may be various display devices such as a liquid crystal display, an organic/inorganic light emitting display device, and the like.

According to the embodiments of the present invention, it is possible to detect a significant crack occurring in a display panel.

According to the embodiments of the present invention, it is possible to easily grasp a position of a crack occurring in a display panel.

According to the embodiments of the present invention, it is possible to accurately detect whether or not a crack occurs in a display panel.

While this invention has been particularly shown and described with reference to exemplary embodiments thereof, it will be understood by those of ordinary skill in the art that various modifications may be made thereto without departing from the spirit and scope of the present invention as defined by the appended claims.

What is claimed is:

1. A display device, comprising:
   a substrate including a display area and a peripheral area peripheral to the display area;
   a plurality of pads disposed in a pad area, wherein the pad area is disposed in the peripheral area and the pad area includes an integrated circuit (IC); and
   a first crack detecting line directly connected to a first pad and a second pad at a first node, and a third pad at a second node, wherein the first crack detecting line is disposed in the peripheral area between the first node and the second node,
   wherein the first node is disposed inside the pad area.

2. The display device of claim 1, further comprising:
   a first wire connecting the first pad and the first crack detecting line, and
   a second wire connecting the second pad and the first crack detecting line,
   wherein the first wire and the second wire are disposed in the same layer, and the first crack detecting line is disposed in a different layer from the first and second wires.

3. The display device of claim 1, further comprising:
   a second crack detecting line connected to a fourth pad, and a fifth pad, wherein the second crack detecting line is disposed in the peripheral area, is disposed at the same side of the display area with the first crack detecting line, and is closer to the display area than the first crack detecting line.

4. The display device of claim 1, further comprising:
   a second crack detecting line connected to a fourth pad and a fifth pad at a third node, and to a sixth pad at a fourth node, wherein the second crack detecting line is disposed in the peripheral area between the third node and the fourth node, is disposed at the same side of the display area with the first crack detecting line, and is closer to the display area than the first crack detecting line; and
   a third crack detecting line connected to a seventh pad, and an eighth pad, and is disposed in a bendable area in the peripheral area.

5. The display device of claim 1, wherein the IC disposed in the pad area is configured to test for a crack of the display device.

6. The display device of claim 5, wherein the IC includes:
   a variable resistor;
   a current regulator that supplies a first current to the variable resistor and supplies a second current to the first crack detecting line through the first pad or the second pad; and
   a comparator that compares a voltage applied to the variable resistor with a voltage applied to the first crack detecting line and outputs a result of the comparison.

7. The display device of claim 6, wherein the second current is the same as the first current.

8. The display device of claim 6, wherein the second current is different from the first current.

9. A display device, comprising:
   a substrate including a display area and a peripheral area peripheral to the display area;
   a plurality of pads disposed in a pad area, wherein the pad area is disposed in the peripheral area and the pad area includes an integrated circuit (IC);
   a first crack detecting line connected to a first pad and a second pad at a first node, and a third pad at a second node, wherein the first crack detecting line is disposed in the peripheral area between the first node and the second node and the first node is disposed inside the pad area;
   a second crack detecting line connected to a fourth pad and a fifth pad at a third node, and to a sixth pad at a fourth node, wherein the second crack detecting line is disposed in the peripheral area between the third node and the fourth node, is disposed at the same side of the display area with the first crack detecting line, and is closer to the display area than the first crack detecting line;
   a third crack detecting line connected to a seventh pad, and an eighth pad, and is disposed in a bendable area in the peripheral area; and
   a voltage transmitting line disposed in the peripheral area and configured to transmit a power supply voltage,
   wherein the first crack detecting line, the second crack detecting line, and the third crack detecting line are disposed in the same layer as the voltage transmitting line.

10. A display device, comprising:
    a substrate including a display area and a peripheral area peripheral to the display area;
    a plurality of pads disposed in a pad area, wherein the pad area is disposed in the peripheral area and the pad area includes an integrated circuit (IC); and
    a first crack detecting line connected to a first pad and a second pad at a first node, and a third pad at a second node, wherein the first crack detecting line is disposed in the peripheral area between the first node and the second node,
    wherein the first node is disposed inside the pad area, and
    wherein the first crack detecting line is connected to a fourth pad at the second node.

* * * * *